United States Patent [19]
Sachdev et al.

[11] Patent Number: 5,231,751
[45] Date of Patent: Aug. 3, 1993

[54] PROCESS FOR THIN FILM INTERCONNECT

[75] Inventors: Krishna G. Sachdev, Hopewell Junction; Benedikt M. J. Kellner, Wappingers Falls; Kathleen M. McGuire, Wallkill; Peter J. Sorce, Poughkeepsie, all of N.Y.

[73] Assignee: International Business Machines Corporation, Armonk, N.Y.

[21] Appl. No.: 784,281

[22] Filed: Oct. 29, 1991

[51] Int. Cl.⁵ .............................. H01K 3/10
[52] U.S. Cl. ...................... 29/852; 156/643; 156/652; 156/901; 427/97; 437/203
[58] Field of Search ................ 29/852; 156/901, 843, 156/652; 427/97; 437/203

[56] References Cited

U.S. PATENT DOCUMENTS

| | | | |
|---|---|---|---|
| 2,692,190 | 10/1954 | Pritikin | 41/42 |
| 3,181,986 | 5/1965 | Pritikin | 156/233 |
| 3,466,206 | 9/1969 | Beck | 156/3 |
| 3,541,222 | 11/1970 | Parks et al. | |
| 4,070,501 | 1/1978 | Corbin et al. | 437/203 |
| 4,604,160 | 8/1986 | Murakami et al. | 156/630 |
| 4,707,657 | 11/1987 | Boegh-Peterson | 324/158 F |
| 4,933,045 | 6/1990 | DiStefano et al. | 29/852 X |

FOREIGN PATENT DOCUMENTS 62-108987  11/1988  Japan .

OTHER PUBLICATIONS

R. P. King, et al., "Screening Masks and Method of Fabrication" IBM Technical Disclosure Bulletin, vol. 20, No. 2, pp. 577-578 (Jul. 1977).

U.S. patent application Ser. No. 07/503,401 filed on Mar. 30, 1990 entitled "Low TCE Polyimides" (IBM Docket No. FI9-90-012).

U.S. patent application Ser. No. 07/695,368 filed on May 3, 1991 entitled "Multi-Layer Thin Film Structure and Parallel Processing Method For Fabricating Same" (IBM Docket No. YO9-90-062).

U.S. patent application Ser. No. 07/740,760 filed on Aug. 5, 1991 entitled "Low RCE Polyimides As Improved Insulator In Multilayer Interconnect Structures" (IBM Docket No. FI9-9-086).

*Primary Examiner*—Carl J. Arbes
*Attorney, Agent, or Firm*—Aziz M. Ahsan

[57] ABSTRACT

This invention relates generally to a structure and process for thin film interconnect, and more particularly to a structure and process for a multilayer thin film interconnect structure with improved dimensional stability and electrical performance. The invention further relates to a process of fabrication of the multilayer thin film structures. The individual thin film structure is termed a compensator, and functions as both a ground-/reference plane and as a stabilizing entity with regard to dimensional integrity. The compensator is comprised primarily of a metal sheet having a metallized via pattern and high-temperature stable polymer as an insulator.

34 Claims, 5 Drawing Sheets

PROCESS FOR THIN FILM INTERCONNECT

CROSS-REFERENCE

This Patent Application is related to U.S. patent application Ser. No. 07/784,345. entitled "Discrete Fabrication of Multi-layer Thin Film Wiring Structures", and U.S. patent application Ser. No. 07/783,959, entitled "Fabrication of Discrete Thin Film Wiring Structures", which were filed concurrently on Oct. 29, 1991, and which are also assigned to the same assignee as this Patent Application, and the disclosure of all of them is incorporated herein by reference.

FIELD OF THE INVENTION

This invention relates generally to a structure and process for a thin film interconnect, and more particularly to a structure and process for multilayer thin film interconnect structures with improved dimensional stability and electrical performance. The invention further relates to a process of fabrication of the particular multilayer thin film structure, termed a "compensator", which functions as a ground plane (i.e., a reference plane). The compensator is comprised primarily of a metal sheet having a metallized via pattern and a high-temperature stable polymer as an insulator.

BACKGROUND OF THE INVENTION

Fabrication of multilayer thin film interconnect structures for high-density integrated circuits generally involves sequential build of metal-patterned dielectric layers on silicon or ceramic substrates. Among the various dielectric/insulator materials which are generally used in the thin film structures, are sputtered or Plasma Enhanced Chemical Vapor Deposition (PECVD) quartz, silicon nitride, and high-temperature stable polymers, especially polyimides. The most commonly used high-conductivity metallurgies are aluminum/copper, gold, and/or copper.

The approach based on sequential building of each layer to form high-density wiring structures, however, suffers from the problem that every time a new layer is fabricated, the previously built layers are exposed to the entire process excursions including thermal, chemical/solvents, mechanical and other stress-related operations.

In addition, since the electrical performance and long-term reliability of the sequentially built structure can only be determined after the conclusion of the entire fabrication process, the finished part may have to be discarded if the performance does not meet the required specifications. This results in high cost of production, and has other obvious limitations in terms of cycle time/throughput.

When using polyimide dielectric (or other high-temperature polymers), an alternate approach to thin film interconnect structures is based on the assembly of individual electrically testable metallized thin films (layers) which are laminated at high temperature such that metal/metal and polymer/polymer bonding can be achieved.

This method eliminates some of the limitations of the sequential process, as each metallized dielectric layer is fabricated as a single unit which can be fully tested for the desired electrical characteristics. Then each of these layers are stacked to form multiple layers and laminated under heat and pressure.

Although this method would be potentially superior to sequential build, it has a fundamental concern with regard to the dimensional stability of the structure during both individual layer build and during the joining of the individual layers to form the composite multilayer structure. This is due to the fact that the thin polymer films, such as polyimide films, are generally fragile and flexible, and are subject to deformation under thermal or solvent-related stress conditions. This can result in pattern misalignment/distortion during layer fabrication or in the process of lamination and also when the composite structure undergoes accelerate reliability tests involving temperature and humidity excursions.

A recent Japanese Patent Application No. 63-274199 (1988) entitled "Multilayer Wiring Formation Method" discloses individual build of layers, comprising polyimide insulator with copper wiring and copper/gold interface metal. This method is based on metal patterning of partially cured polyimide layers formed on a substrate, after which the layers are peeled off from the substrate, smoothed by vacuum, stacked, and then laminated in one step by heating under pressure. During this process, interlayer bonding occurs due to polymer interdiffusion at the interface which is also accompanied by full polymer cure, and at the same time gold/gold joining causes metal interconnections. However, the process according to this process would suffer the limitations of potential pattern misalignment/distortion mentioned above.

The following references relate generally to methods of forming metallurgical patterns in insulator films:

U.S. Pat. No. 2,692,190, issued to N. Pritikin (1954) discloses a method for generating embedded metallurgy to fabricate printed circuits having large dimensions on a temporary base plate which is removed by chemical etching every time. After the conductor pattern is defined, and an insulator such as Teflon, polystyrene etc., is applied, the base plate is removed by a selective etching process.

Another U.S. Pat. No. 3,181,986, issued to N. Pritikin, (1965) also relates to printed circuits. The primary difference between this Patent and U.S. Pat. No. 2,692,190, is that the temporary base plate is not consumed each time and thus the process is less expensive.

U.S. Pat. No. 3,466,206, issued to J. T. Beck, (1969) also relates to a method of making embedded printed circuits, having integral aligned through terminals exposed on both sides by a subtractive etch process. The metal sheet can be copper, silver, gold, brass, stainless steel etc., and the insulator is a thermosetting or cold-setting resin, self-hardening resin or one which requires heat and pressure for cure, including epoxies, phenolics, melamine, Teflon, or composites with glass fillers.

U.S. Pat. No. 3,541,222, issued to H. L. Parks, et al., (1970) discusses a connector screen or "interposer" comprising conductive connector elements embedded in a deformable insulator such that the conductive elements are protruding from both sides.

U.S. Pat. No. 4,604,160, issued to K. Murakami et al., (1986) discloses a method for fabricating a flexible printed wiring board with emphasis on the adhesion of the plating resist and the conductor pattern during the plating process. .

U.S. Pat. No. 4,707,657, issued to A. Boegh-Petersen, (1987) is concerned with double-sided printed circuit boards of a connector assembly, thin film and thick film circuit board, and multilayer circuit board.

U.S. patent application, Ser. No. 07/503,401, filed Mar. 30, 1990, and assigned to the assignee of the present Patent Application, the disclosure of which is incorporated herein by reference, describes low thermal expansion polyimides with special properties for use as a polymer dielectric and/or passivation layer in fabricating multilayer metal structures.

OBJECTS AND SUMMARY OF THE INVENTION

One object of this invention is to provide a method for fabrication of a compensator for use in multilayer thin film structures to serve as a ground/reference plane for the signal wiring, and to provide dimensional stability to the structure.

Another object is to provide a compensator with molybdenum or copper/Invar/copper as the metal core, high-temperature polyimide as the insulator, and aluminum, copper, gold, tungsten, or alloys thereof, as the via metallurgy.

Another object is to provide a compensator with molybdenum or copper/Invar/copper as the metal core, high-temperature polyimide with low thermal coefficient of expansion (TCE) as the dielectric/insulator, and aluminum/copper, copper, tungsten, or gold as the via metallurgy.

Another object is to provide a compensator for use in multilayer thin film structure such that the end device has improved electrical performance and dimensional stability.

These objects of the present invention are achieved using a novel compensator and process of fabricating the same. Hole filling with polymer is achieved by a special technique in two or three applications, with partial bake/cure between applications, and the final cure after the last top sided coating for a definite thickness.

This process is not limited to any particular set of materials in terms of the metal type or polymer chemistry.

One object of this invention is a new concept in fabricating a multilayer wiring structure, referred to as a "compensator", which is used as an integral part of thin film structure for enhancement of electrical performance and for providing dimensional stability of the thin film structure.

Another object of this invention is to use the compensator in a multilayered structure.

Still another object of this invention is a process of making the compensator comprising the steps of:

(a) Etching a through-via in a metal foil/electrically conductive material such that the via pattern corresponds to a knife-edge configuration.

(b) Deposition of a thin layer of adhesion metal on both sides of the metal foil and conformal coating of the same metal on the via sidewalls, providing uniform coverage for the purpose of obtaining durable polymer/metal adhesion at all contacting surfaces.

(c) Application of a thermally stable polymer release layer onto the rigid support.

(d) Application of a polymer coating on top of the release layer on the rigid support and drying/partially curing to form a tack-free film.

(e) Lamination of the via-etched metal sheet onto the polymer on the rigid support.

(f) Filling the via with at least one polymer, using spray, extrusion coating, or doctor blading, with partial curing of the polymer between applications.

(g) Final coating of a polymer to form the required thickness on the top surface of the rigid support having the metal foil, and bake/cure to the final polymer cure temperature.

(h) Planarization of the top surface of the metal foil or the compensator using any of standard polishing techniques.

(i) Etching of via holes through the polymer and removal of debris by subjecting to oxygen plasma ashing or oxygen reactive-ion-etch conditions.

(j) Metallization of the etched via to form a seed layer, followed by electroplating of the metal to fill the vias.

(k) Polishing to generate the planar structure of a compensator having via metallurgy coplanar with the polymer dielectric.

(l) Optional thickening of one or both sides of the metallized via to form a raised "cap".

In one aspect this invention is a compensator interconnect structure used in forming a multilayer thin-film structure, said compensator comprising at least one metal layer, said metal layer having at least one opening, at least one layer of at least one polymer conformly coating said metal layer and lining said at least one opening, and wherein said opening has at least one via metal stud.

In another aspect this invention is a process for the fabrication of a compensator interconnect used in forming a multilayer thin-film structure, said process comprising the steps of, a) forming at least one via hole in at least one metal foil, b) securing said at least one metal foil having said at least one via hole to a partially cured first polymer layer that is formed on a rigid substrate, c) the exposed surfaces of said metal foil least one second polymer, such that said second covers the exposed surfaces of said metal foil and completely fills said at least one via hole, d) subjecting the structure of step c) to a temperature of at least 300 degrees C., to cure said first and said second polymer, e) forming at least one via hole through said at least one polymer filled via, such that said via hole extends through the entire thickness of said polymer, f) filling said at least one via hole with at least one electrically conductive material to form a via metal stud, and g) removing said rigid substrate to form said compensator interconnect.

In still another aspect this invention is a process for the fabrication of a compensator interconnect used in forming a multilayer thin-film structure, said process comprising the steps of, a) forming at least one via hole in at least one metal foil, b) securing said at least one metal foil having said at least one via hole to a partially cured first polymer layer that is formed on a rigid substrate, c) covering the exposed surfaces of said metal foil with at least one second polymer, such that said second polymer covers the exposed surfaces of said metal foil and completely fills said at least one via hole, d) subjecting the structure of step c) to a temperature of at least 300 degrees C., to cure said first and said second polymer, e) forming at least one via hole through said at least one polymer filled via, such that said via hole extends through the entire thickness of said polymer, f) forming at least one blind via hole through said polymer such that said blind via hole exposes a portion of said metal foil, g) filling said at least one via hole and said at least one blind via hole with at least one electrically conductive material to form a via metal stud and a blind via metal stud, and h) removing said rigid substrate to form said compensator interconnect.

These and other objects and aspects of the invention will become more apparent after referring to the following description considered in conjunction with the accompanying drawings.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows, taken in conjunction with the accompanying drawings in which:

DETAILED DESCRIPTION OF THE INVENTION

This invention describes an improved method of fabrication of multilayer interconnect structures and specifically a method of fabrication of a compensator which forms an integral part of the total thin film structure. The compensator serves as a ground/reference plane for the signal wiring, and provides improved electrical performance and dimensional stability.

Figure 1:
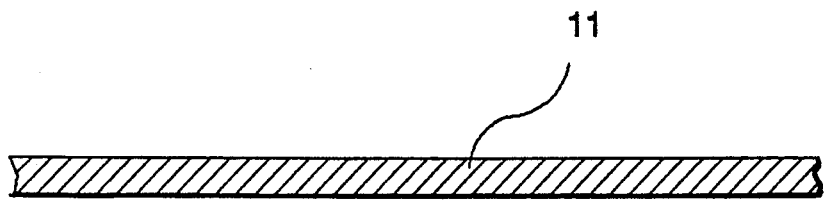
FIG. 1 shows a thin metal foil that is used to form the metal core of the compensator of this invention.

As shown in FIG. 1, a single layer thin metal foil 11, is used to make the metal core of the compensator of this invention. The thin metal foil 11, could be made from a metal selected from a group comprising copper, molybdenum, titanium, tungsten, Invar, and alloys thereof. It is preferred that the thin metal foil 11, is approximately 1.4 mil to about 2.0 mil thick. The thin metal foil 11, could be a single layer foil comprising of a single material, or a multilayer foil comprising of a multilayered stacked material, or a single layer foil comprising of an alloyed material.

Figure 2:
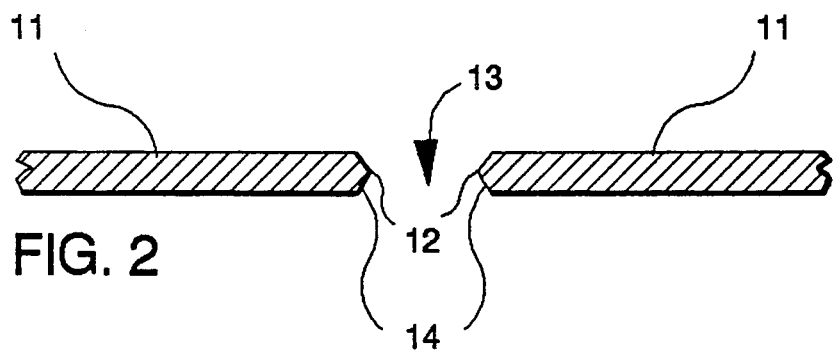
FIG. 2 illustrates the metal core of the compensator after it has been etched from both sides to form two knife-edges in the via opening.

FIG. 2 illustrates the thin metal foil 11, after it has been etched from both sides to form two knife-edges 12, in the via opening 13, having via sidewalls 14. This double-sided etching of the thin metal foil 11, such as a molybdenum foil, is done by etching techniques well-known in the art. See for example "Screening Masks and Method of Fabrication" I.B.M. Technical Disclosure Bulletin, Vol. 20, No. 2, pp. 577–578, (July 1977) the disclosure of which is incorporated herein by reference. The thin metal foil 11, itself is held in a holder (not shown), and care is taken that in this holder the thin metal foil 11, is not under too much tension or relaxation.

According to this invention, a knife-edge 12, configuration is important for achieving uniform coverage of the via sidewalls 14, with an adhesion metal which is essential to metal/polymer adhesion durability during fabrication and accelerated testing, and for performance reliability of the electronic device. This is especially important when the polymer, such as a polyimide, is derived from rigid-rod precursors and has a low thermal coefficient of expansion (TCE) (in-plane TCE, typically less than 15 ppm/degrees C. at 100 degrees C.).

Figure 3:
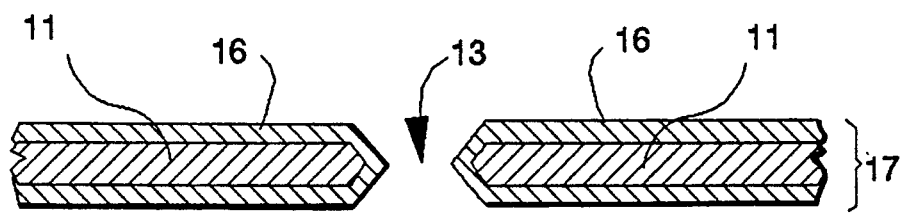
FIG. 3 shows the metal core of the compensator after the application of a thin layer of adhesion metal on both sides of the foil as well is in the via opening.

FIG. 3 shows the thin metal foil 11, used in compensator fabrication after the application of a thin layer of adhesion metal 16, on both sides of the metal foil 11, as well is in the via opening 13. This is also referred to as compensator core 17. Uniform coverage of the thin layer of adhesion metal 16, is done by sputter deposition, chemical vapor deposition (CVD), or electron-beam evaporation from both sides of the metal foil 11. The material for the thin layer of adhesion metal 16, could be selected from a group comprising chromium, copper, tantalum, titanium, or alloys thereof.

Figure 4:
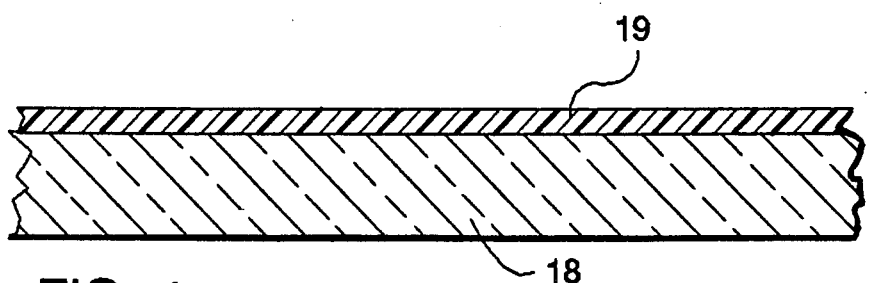
FIG. 4 shows a rigid support with a thermally stable polymer layer on the upper surface.

In order to physically support the thin metal foil 11, and the attached material through subsequent processing, a rigid support is needed. This is accomplished by taking a rigid support 18, and applying a first layer of polymer 19, over at least one of the surfaces. This is illustrated in FIG. 4. The rigid support 18, could be a metal plate or a glass plate.

A high-temperature stable polymer, such as a polyimide, is typically used as the insulator 19. This polymer is preferably a low thermal expansion (TCE) polyimide, such as the one derived from biphenic dianhydride—p-phenylene diamine (BPDA-PDA) and related materials. Low TCE polyimides including BPDA-PDA are described in U.S. patent application, Ser. No. 07/503,401, filed Mar. 30, 1990, the disclosure of which is incorporated herein by reference. According to the present invention, this polyimide can also be used to encapsulate the compensator core 17, and provide insulation between the via metallurgy and the metal via sidewalls 14. U.S. patent application, Ser. No. 07/740,760, filed on Aug. 5, 1991, entitled "Low TCE Polyimides as Improved Insulator in Multilayer Interconnect Structure", the disclosure of which is incorporated herein by reference, describes a high-density interconnect device and packaging structure having a low TCE polyimide insulator/dielectric and passivation layer and method of making such structures by sequential processing. The preferred low TCE polyimide is BPDA-PDA. According to the present invention, the low TCE polyimides, typically BPDA-PDA, provide matching thermal expansion with the molybdenum metal foil (both have TCEs about 5-6 ppm/°C. at 100 degrees C.) and thus the composite structure has low interfacial residual stress and improved performance reliability. Thermal expansion mismatch is one of the major causes of high thermal stress in multilayer structures involving contacting materials of diverse characteristics. In addition to providing TCE match, the low TCE polyimides have lower moisture uptake and lower dielectric constant than conventional polymers, and thus provide improved performance and long-term device performance reliability of the thin film interconnect structure comprising the laminated assembly of the individually fabricated layers including the compensator as one of the building blocks.

Figure 5:
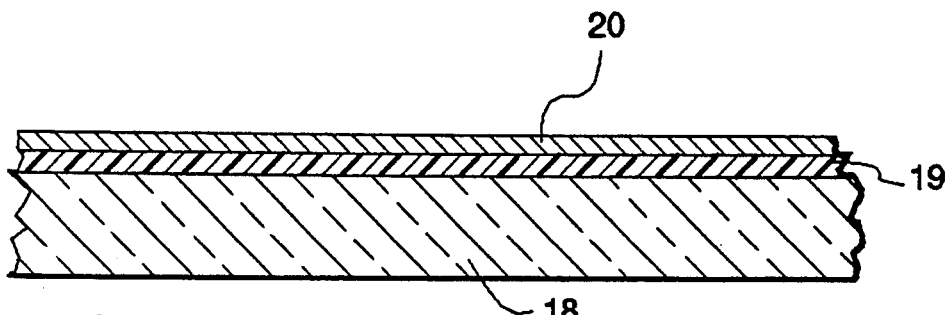
FIG. 5 shows the addition of a metal layer on top of the polymer layer from FIG. 4.

The first polymer layer 19, of FIG. 4, is then fully cured in a nitrogen-purged oven. Subsequently, a metal layer 20, which is normally a multilayer, such as comprising chromium-copper-chromium layers, is blanket deposited onto this first polymer layer 19, as shown in FIG. 5. The metal layer 20, serves as an etch or laser stop layer in the process by which the finished compensator is removed from the rigid support 18. The metal layer 20, optionally can also serve as the base metal for circuitization of one side of the finished compensator, such that it itself forms a wiring layer.

Figure 6:
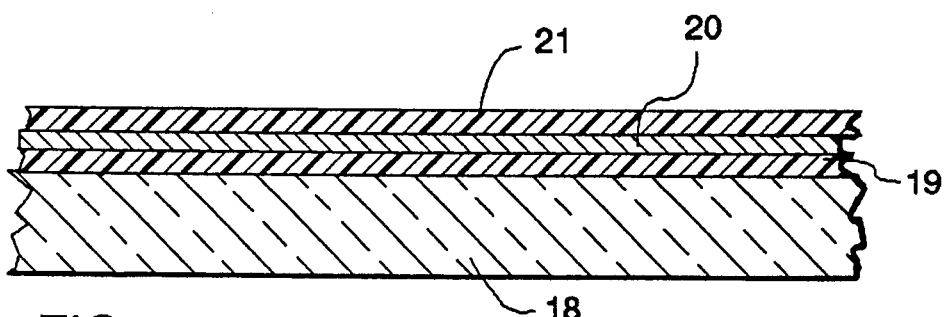
FIG. 6 shows a partially cured second polymer layer on top of the metal layer from FIG. 5.

Finally, a second layer of polymer 21, is applied on top of the metal layer 20. This is illustrated in FIG. 6. The second polymer layer 21, is partially cured in a nitrogen-purged oven. This second polymer layer 21, is to remain as an integral part of the compensator and serves as an interlevel dielectric/insulator for the metallized structure.

The material for the polymer layers 19 and 21, can be selected from a group comprising polyimides in general, and, in the case of layer 21, preferably low TCE polyimides, aromatic polyesters, polyester-polyamides, and polyether-polyimides.

Figure 7:
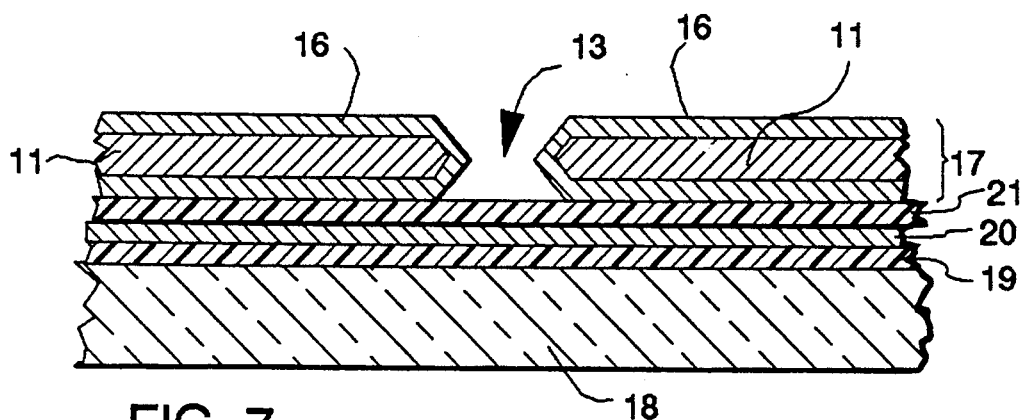
FIG. 7 illustrates the lamination of the etched metal foil with the thin layer of adhesion metal of FIG. 3, onto the partially cured polymer on the rigid support of FIG. 6.

FIG. 7 illustrates the lamination of the compensator core 17, shown in FIG. 3, having the thin layer of adhesion metal 16, to the second polymer layer 21, over the rigid support 18, as shown in FIG. 6. This lamination is typically done by placing the compensator core 17, over the second polymer layer 21, such as a polyimide coating, and heating up to 150 degrees C. at 2-3 degrees C./min ramp rate, while applying 50 psi pressure.

Figure 8:
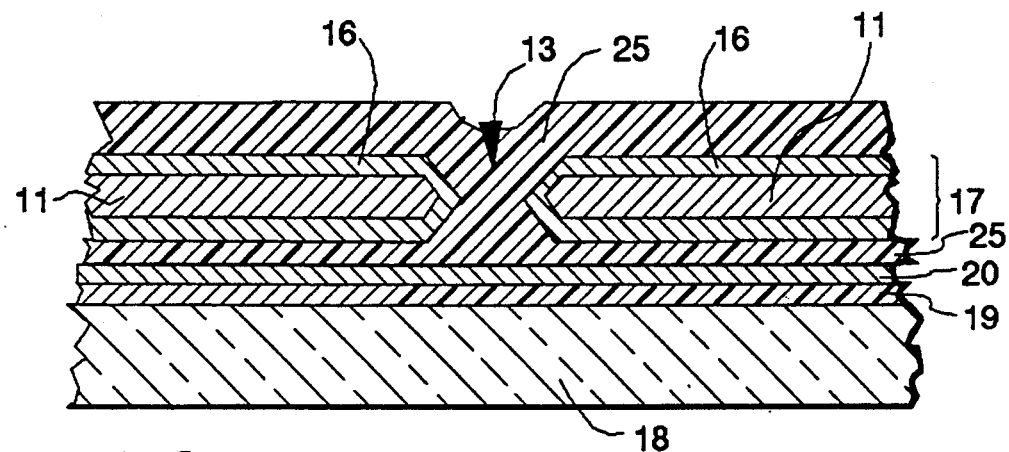
FIG. 8 shows the openings in the laminated structure of FIG. 7 filled with a polymer.

The via openings 13, in the compensator core 17, are then filled with a polymer. This is illustrated in FIG. 8, which shows the thin metal foil 11, having openings or via patterns 13, filled with a polymer 25, such as a polyimide. In order to obtain a good bond, the polymer 25, should be of the same material as the partially cured second polymer layer 21, as shown in FIG. 8, or it could be of a different material as long as it is compatible with the partially cured second polymer 21, that was applied on the surface of the rigid support 18. As shown in FIG. 8, the polymer 25, is the same as polymer 21, and therefore they diffuse and form a single polymer 25. The via fill process according to this invention is such that it provides void-free polyimide-filled vias.

Figure 9:
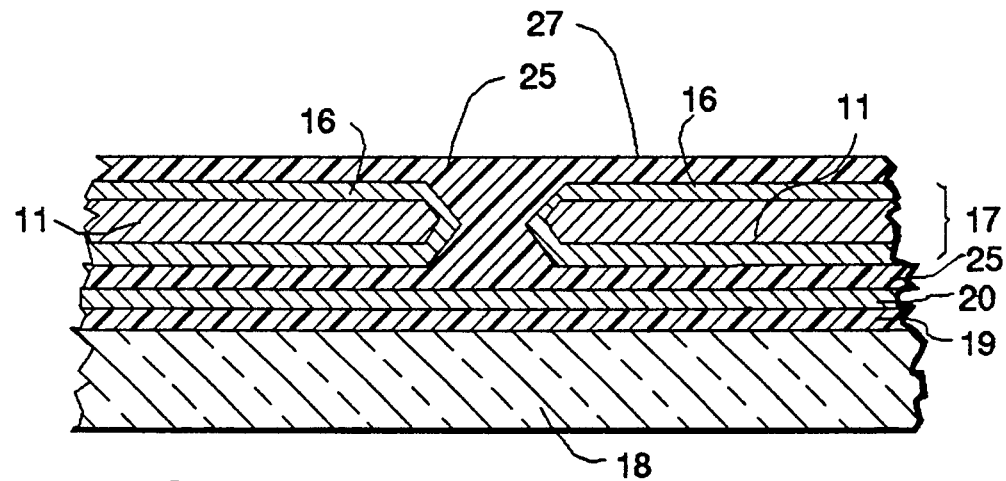
FIG. 9 illustrates the structure of FIG. 8, after planarization of the upper surface.

After the via openings 13, are filled with the polymer 25, and the upper surface of the compensator core 17, has had a sufficient deposition of polymer 25, the structure is then cured to 350–400 degrees C. The top surface of the cured structure preferably is planarized. FIG. 9, illustrates the structure after planarization, with the polyimide having a planarized surface 27.

Figure 10:
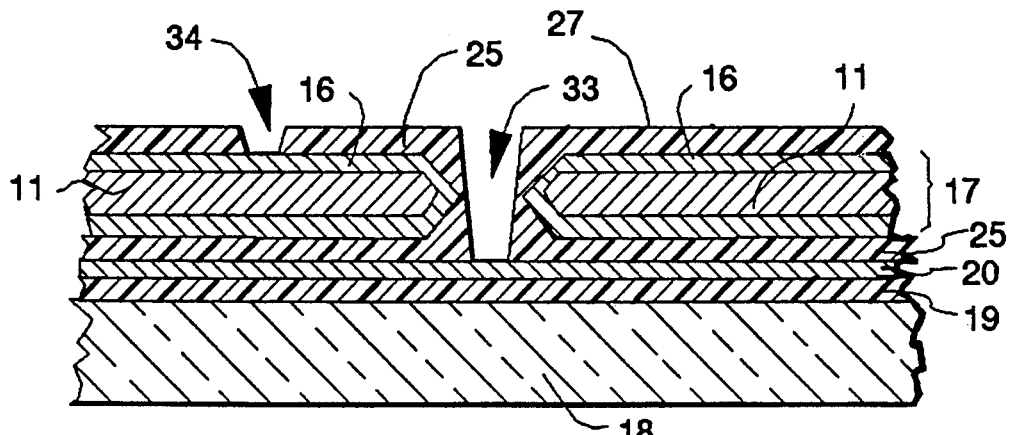
FIG. 10 shows etching of via holes within the planarized structure of FIG. 9.

After the structure has been planarized, openings or etched via holes 33 and 34, are formed in the polymer or the polyimide 25, as shown in FIG. 10. These openings or etched via holes 33 and 34, within the planarized structure are normally done by laser etching the via holes 33 and 34. The via hole or opening 33, must penetrate the entire thickness of the polymer 25, and the second polymer layer 21, and expose the upper surface of the metal layer 20. Similarly, the via hole or opening 34, must penetrate the entire thickness of the polymer 25, and expose at least a portion of the upper surface of the thin layer of adhesion metal 16, covering the thin metal foil 11. Plasma ashing can then be done to remove ablation debris.

Figure 11:
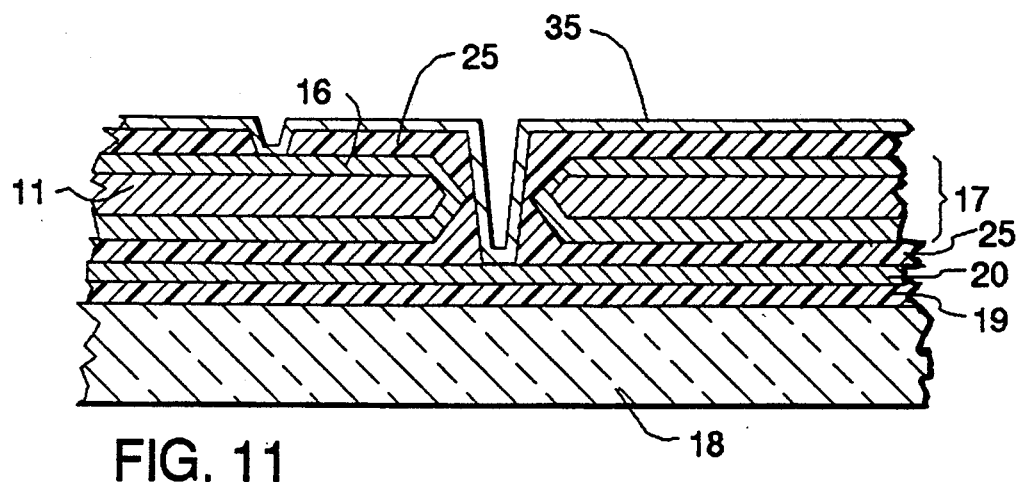
FIG. 11 illustrates a conformal coating of the planarized etched structure of FIG. 10 with a metal seed layer.

In order to start a via stud in the openings 33 and 34, it is preferred to first form a metal seed layer that is essentially conformal with respect to the upper planarized surface of the compensator core as well as the via geometry. This is illustrated in FIG. 11. The metal seed layer 35, is typically selected from a group comprising chromium or copper or alloys thereof.

Figure 12:
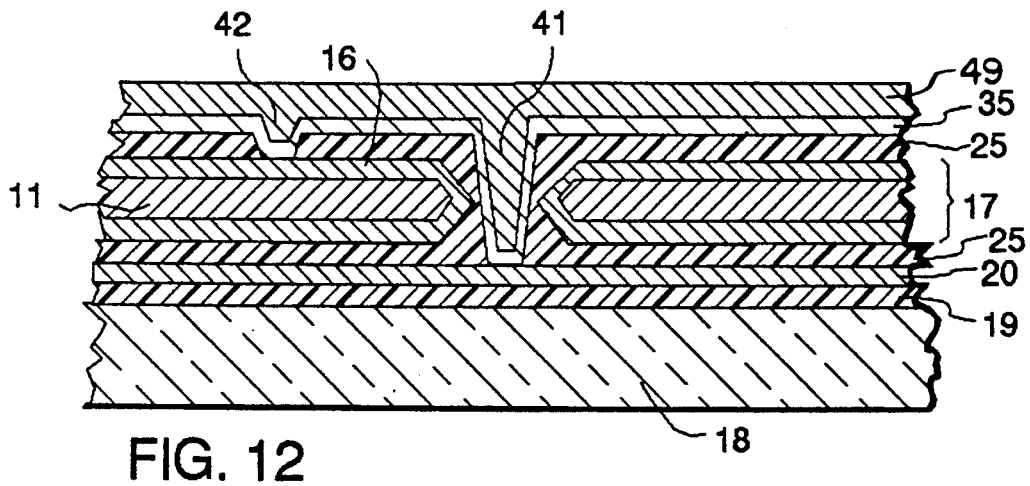
FIG. 12 shows the conformal deposition of an electrically conductive metal over the metal seed layer and filling of the vias with an electrically conductive material.

Once the metal seed layer 35, has been formed, the now well-defined via can be filled with an electrically conductive stud metal material 49, forming electrically conductive metal studs 41 and 42, as shown in FIG. 12. The conductive stud metal material 49, could be of a different material than the metal seed layer 35, as shown in FIG. 12, or it could also be of the same material. The preferred material for the conductive stud metal material 49, is selected from a group comprising aluminum, copper, gold, tungsten, and alloys thereof. The electrically conductive metal stud 41, can be formed in the opening by a variety of methods, for instance electroplating, sputtering, or evaporation, to name a few.

Figure 13:
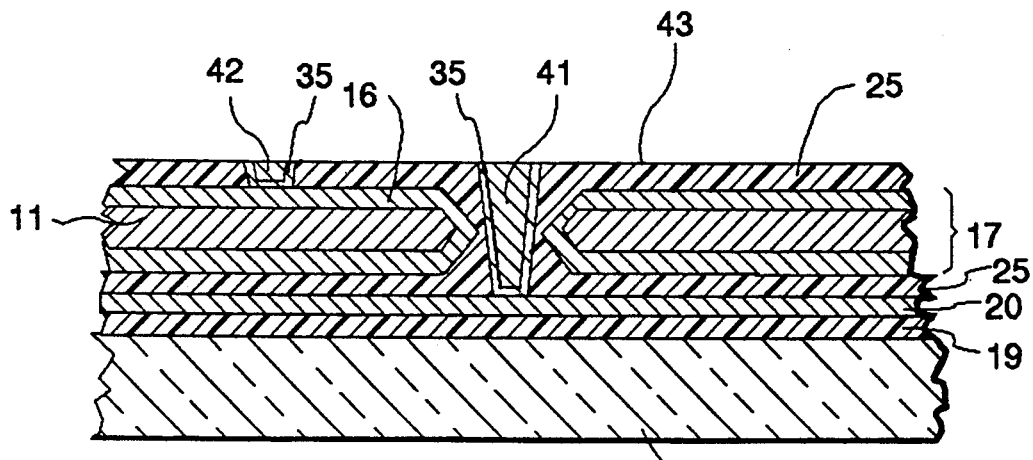
FIG. 13 illustrates the structure of FIG. 12 after planarization.

After the electrically conductive metal stud 41, has been formed, the upper surface of the compensator is usually planarized, forming a planarized surface 43, as illustrated in FIG. 13. Planarization of the surface removes the excess stud metal material 49, and the seed metal layer 35, from all areas other than the studs. This planarization process also insures that there will be a minimum number of defects, and that defects that may be formed on one level do not affect other levels or layers. The planarization method that is used should be such that the upper surfaces of the conductive metal studs 41 and 42, and the polymer layer 25, remain coplanar. Typically, such planarization is done by means of polishing techniques such as chem-mech polishing.

Optionally, the surfaces of the metallized vias are thickened by means of standard metallization processes, in order to form a raised "cap" which can aid in the subsequent joining of the individual layers of the thin film structure.

The compensator 50, can now be removed from the rigid support 18. This can be accomplished in a number of ways, for example if the rigid support 18, is a glass plate or optically transparent material, then the removal can be carried by laser ablation of the bottom of the structure through the rigid support 18, as disclosed in C. Narayan, et al., U.S. patent application Ser. No. 07/695,368, filed on May 31, 1991, the disclosure of which is incorporated herein by reference.

Figure 14:
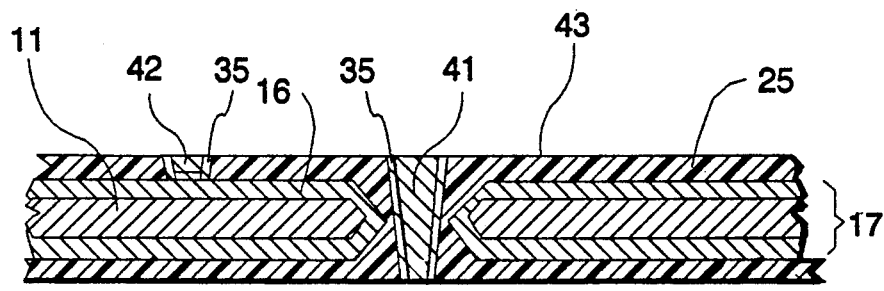
FIG. 14 shows the completed compensator after removal from the rigid support.

FIG. 14, shows the completed compensator 50, after removal from the rigid support 18, the first layer of polymer 19, and the metal layer 20. The rigid support 18, is removed by any of several methods known to those skilled in the art, for instance, by the use of a release layer or laser ablation as discussed earlier. The compensator 50, primarily comprises the compensator core material 17, as well as the insulator layers 21 and 25, the via metal studs 41 and 42, and the metal seed layer 35. The compensator 50, could also contain one or more blind vias 42.

Figure 15:
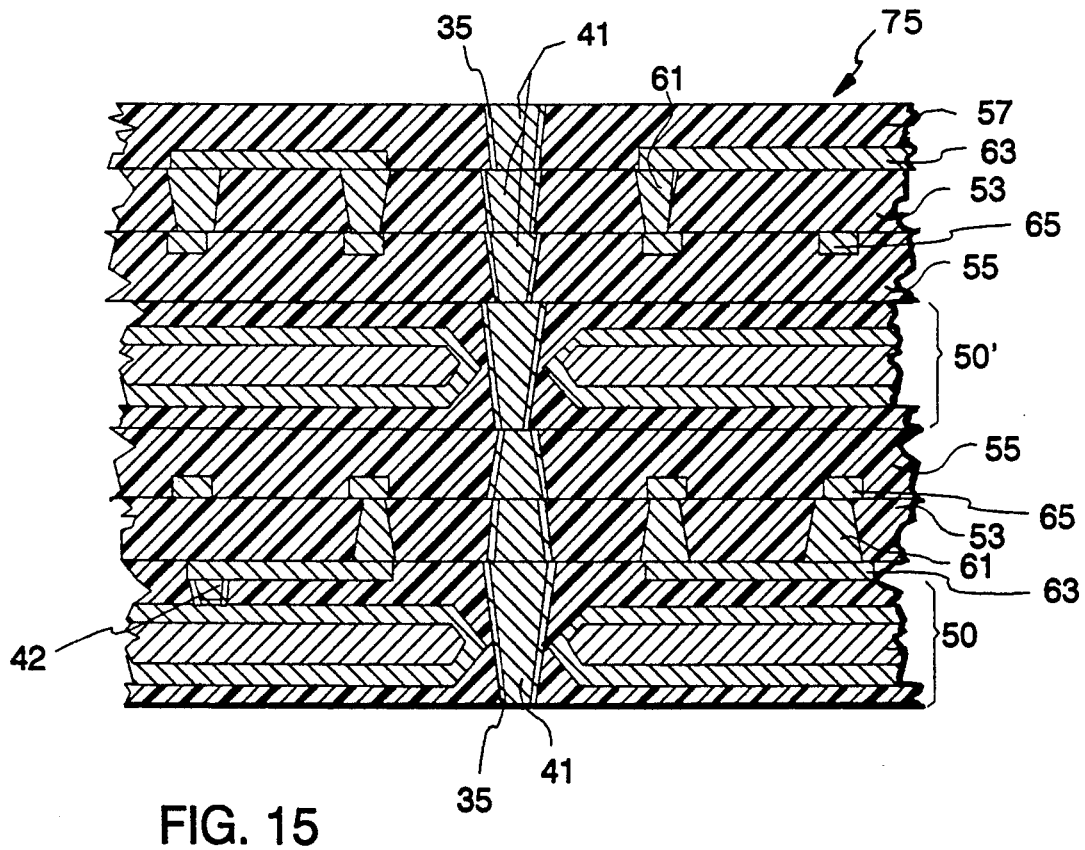
FIG. 15 illustrates the inclusion of completed compensators within a multilayer thin film interconnect structure.

FIG. 15 illustrates the use of completed compensators 50, in a multilayer thin film interconnect structure 75. The completed structure also contains electrically conductive X-signal line layer 53, electrically conductive Y-signal line layers 55, and a layer 57, which forms the top surface metallurgy layer. Vias 51, can be used to connect one wiring layer to another, such as X-wiring layer 53, to a Y-wiring layer 55. The compensator 50, insures that cross-talk between different wiring layers is reduced, if not fully eliminated. Vias 41 and 51, can be stacked during the process to connect the bottom surface metallurgy (not sown) to the top surface metallurgy shown in layer 57. The electrically conductive X-signal line layer 53, has at least one X-signal line 63, that may connect to one or more Y-signal line 65, through one or more through-via 61. As shown in FIG. 15, a compensator 50', is illustrated which is similar to the compensator 50, except it does not have the blind via 42.

The advantages of the present invention will become more apparent after referring to the following example.

EXAMPLE

The following example is intended to further illustrate the invention and is not intended to limit the scope of the invention in any manner.

Double-sided etched molybdenum (1.4 mil thick) with knife-edge vias is made according to molybdenum etch techniques using photoresists and masks which are well known in the art. See for example, "Screening Masks and Method of Fabrication" I.B.M. Technical Disclosure Bulletin, Vol. 20, No. 2, pp. 577-578, (July 1977).

A thin layer (200-500 A) of chromium is evaporated onto both sides of the etched molybdenum foil such that it not only forms a continuous film on the top and bottom surfaces, but also forms a conformal film on the via sidewalls.

For use as a rigid support, a glass plate is coated on one side with 10 micron of polyimide which is fully cured. This polymer application is accomplished by means of spin, spray, or roller coating. A layer of chromium-copper-chromium metallurgy is then sputtered on top of this initial layer of polymer. The top and bottom cladding layer of chromium is preferably between 200 to 400 Angstrom thick and the copper layer is preferably 1 to 2 microns thick. Subsequently, a second layer (10 microns thick) of polymer is deposited on top of the metal layer. This polymer layer is then baked between 65 and 80 degrees Celsius for 60 minutes in a nitrogen-purged oven.

The molybdenum foil having a chromium adhesion layer is laminated onto the polyimide by applying 50 psi pressure and heating up to 150 degrees Celsius at 2-3 degrees/minutes ramp rate, holding at 150 degrees Celsius for 30 minutes, and then cooling down to room temperature.

For the next operation of via fill, polyimide precursor solution in a high-boiling solvent, typically N-methylpyrrolidone (NMP), is puddled onto the molybdenum surface, the polymer is allowed to permeate down and fill the holes, then doctor-bladed to squeeze out the excess from the surface region, and baked/cured at 80 degrees for 60 minutes and between 120 and 150 degrees for 60 minutes, and allowed to cool to room temperature. This polymer application process is repeated twice, with a bake between 120 and 150 degrees Celsius for 60 minutes between applications.

After the via fill operation, a uniform layer of polymer is formed on the top by spin, spray, or roll coating, followed by bake/cure up to 400° C. according to the following temperature cycle: 85° C. for 60 minutes, 140° C. for 60 minutes, 230° C. for 60 minutes, 300° C. for 45 minutes, and 350°-400° C. for 60 minutes.

After the polymer via fill and application of the top coating, the via holes are laser ablated through the polymer, with a sidewall angle of 70-75 degrees. The part is then subjected to an oxygen plasma ash to remove ablation debris.

Metallization of the via holes is then done by sputter seed deposition of chromium/copper (200-400 A chromium/0.3-1 um copper), then electroplating of copper, followed by polishing until the desired level of planarization is achieved.

The compensator is then removed from the glass plate. This can be accomplished by laser ablation of the bottom of the structure through the glass plate, as disclosed in C. Narayan, et al., U.S. patent application Ser. No. 07/695,368, filed on May 31, 1991, the disclosure of which is incorporated herein by reference. The bottom metal layer in the structure acts as a laser stop. Subsequently, the bottom polymer layer is removed by any technique known to one skilled in the art, e.g., oxygen plasma ashing. The bottom metal layer can then be removed by etching. Alternatively, this bottom metal layer can be patterned such that it itself forms a wiring layer, which can then become an integral part of the compensator.

For multilayer interconnect structures, wiring layers can be formed on this compensator. Such layers can then be stacked/assembled such that the metal vias are aligned from layer to layer, and the individual layers are then laminated by applying heat and pressure. The thin film composite structure can then be laminated on top of a multilayer ceramic substrate to obtain a high-density packaging device. Advantages of individual build of metallized dielectric thin films are: greater throughput, lower cost, and the building blocks can be fully tested prior to assembly and lamination into the composite package, all of this allowing for fine-line wiring with reliable layer-to-layer alignment and high-density circuits.

While the present invention has been particularly described in conjunction with a specific preferred embodiment, it is evident that many alternatives, modifications, and variations will be apparent to those skilled in the art in light of the foregoing description. It is therefore contemplated that the appended claims will embrace any such alternatives, modifications, and variations as falling within the true scope and spirit of the present invention.

What is claimed is:

1. A process for the fabrication of a compensator interconnect used in forming a multilayer thin-film structure, said process comprising the steps of,
 a) forming at least one via hole in at least one metal foil,
 b) securing said at least one metal foil having said at least one via hole to a partially cured first polymer layer that is formed on a rigid substrate,
 c) covering the exposed surfaces of said metal foil with at least one second polymer, such that said second polymer covers the exposed surfaces of said metal foil and completely fills said at least one via hole,
 d) subjecting the structure of step c) to a temperature of at least 300 degrees C., to cure said first and said second polymer,
 e) forming at least one via hole through said at least one polymer filled via, such that said via hole extends through the entire thickness of said polymer,
 f) filling said at least one via hole with at least one electrically conductive material to form a via metal stud, and
 g) removing said rigid substrate to form said compensator interconnect.

2. The process of claim 1, wherein after step a) at least one layer of an adhesion metal is deposited on said metal foil, such that said adhesion metal covers the entire exposed metal foil surfaces and lines said at least one via hole.

3. The process of claim 1, wherein at least one or both of said polymer layers is a BPDA-PDA polyimide layer.

4. The process of claim 1, wherein in step a) said metal foil has a knife-edge configuration in said at least one via hole.

5. The process of claim 1, wherein said via stud is formed by electroplating, sputtering, or evaporation.

6. The process of claim 1, wherein the rough surfaces are planarized by polishing techniques.

7. The process of claim 2, wherein said adhesion metal is selected from a group consisting of chromium, copper, nickel, tantalum, titanium, or alloys thereof.

8. The process of claim 1, wherein the material for said at least one metal layer is selected from a group consisting of copper, Invar, molybdenum, tungsten, or alloys thereof.

9. The process of claim 1, wherein said electrically conductive material to form said via metal stud is selected from a group consisting of aluminum, copper, gold, tungsten or alloys thereof.

10. The process of claim 1, wherein at least one of said polymer is a high-temperature stable polyimide derived from polyamic acid or polyamic ester precursors.

11. The process of claim 1, wherein at least one of said polymer is low thermal expansion polyimide BPDA-PDA with in-plane thermal coefficient of expansion of 5-6 ppm/degrees C. at 100 degrees C. and formed from biphenic dianhydride—p-phenylene diamine.

12. The process of claim 1, wherein said at least one metal layer is made from an electrically conductive material.

13. The process of claim 1, wherein in step b) said rigid substrate has at least one electrically conductive etch-stop layer.

14. The process of claim 13, wherein at least one electrical circuit is formed, with said etch-stop layer.

15. The process of claim 14, wherein said etch-stop layer is integrated into said multilayer thin-film structure.

16. The process of claim 1, wherein in step f) said at least one via hole has a conformal coating of a metal seed layer.

17. The process of claim 16, wherein said metal seed layer is selected from a group consisting of chromium or copper or alloys thereof.

18. A process for the fabrication of a compensator interconnect used in forming a multilayer thin-film structure, said process comprising the steps of,
 a) forming at least one via hole in at least one metal foil,
 b) securing said at least one metal foil having said at least one via hole to a partially cured first polymer layer that is formed on a rigid substrate,
 c) covering the exposed surfaces of said metal foil with at least one second polymer, such that said second polymer covers the exposed surfaces of said metal foil and completely fills said at least one via hole,
 d) subjecting the structure of step c) to a temperature of at least 300 degrees C., to cure said first and said second polymer,
 e) forming at least one via hole through said at least one polymer filled via, such that said via hole extends through the entire thickness of said polymer,
 f) forming at least one blind via hole through said polymer such that said blind via hole exposes a portion of said metal foil,
 g) filling said at least one via hole and said at least one blind via hole with at least one electrically conductive material to form a via metal stud and a blind via metal stud, and
 h) removing said rigid substrate to form said compensator interconnect.

19. The process of claim 18, wherein after step a) at least one layer of an adhesion metal is deposited on said metal foil, such that said adhesion metal covers the entire exposed metal foil surfaces and lines said at least one via hole.

20. The process of claim 18, wherein at least one or both of said polymer layers is a BPDA-PDA polyimide layer.

21. The process of claim 18, wherein in step a) said metal foil has a knife-edge configuration in said at least one via hole.

22. The process of claim 18, wherein said via metal stud or said blind via metal stud is formed by electroplating, sputtering, or evaporation.

23. The process of claim 18, wherein the rough surfaces are planarized by polishing techniques.

24. The process of claim 19, wherein said adhesion metal is selected from a group consisting of chromium, copper, nickel, tantalum, titanium, or alloys thereof.

25. The process of claim 18, wherein the material for said at least one metal layer is selected from a group consisting of copper, Invar, molybdenum, tungsten, or alloys thereof.

26. The process of claim 18, wherein said electrically conductive material to form said via metal stud or said blind via metal stud is selected from a group consisting of aluminum, copper, gold, tungsten or alloys thereof.

27. The process of claim 18, wherein at least one of said polymer is a high-temperature stable polyimide derived from polyamic acid or polyamic ester precursors.

28. The process of claim 18, wherein at least one of said polymer is low thermal expansion polyimide BPDA-PDA with in-plane thermal coefficient of expansion of 5-6 ppm/degrees C. at 100 degrees C. and formed from biphenic dianhydride—p-phenylene diamine.

29. The process of claim 18, wherein said at least one metal layer is made from an electrically conductive material.

30. The process of claim 18, wherein in step b) said rigid substrate has at least one electrically conductive etch-stop layer.

31. The process of claim 30, wherein at least one electrical circuit is formed with said etch-stop layer.

32. The process of claim 31, wherein said etch-stop layer is integrated into said multilayer thin-film structure.

33. The process of claim 18, wherein in step g) said at least one via hole and said at least one blind via hole has a conformal coating of a metal seed layer.

34. The process of claim 33, wherein said metal seed layer is selected from a group consisting of chromium or copper or alloys thereof.

* * * * *